US 011742242B2

United States Patent
Shih et al.

(10) Patent No.: US 11,742,242 B2
(45) Date of Patent: Aug. 29, 2023

(54) METHOD FOR MANUFACTURING THROUGH-SILICON VIA WITH LINER

(71) Applicant: NANYA TECHNOLOGY CORPORATION, New Taipei (TW)

(72) Inventors: Shing-Yih Shih, New Taipei (TW); Sheng-Fu Huang, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/584,383

(22) Filed: Jan. 26, 2022

(65) Prior Publication Data

US 2022/0148915 A1    May 12, 2022

Related U.S. Application Data

(62) Division of application No. 16/807,138, filed on Mar. 2, 2020, now Pat. No. 11,289,370.

(51) Int. Cl.
*H01L 21/768* (2006.01)
*H01L 23/48* (2006.01)

(52) U.S. Cl.
CPC .. *H01L 21/76898* (2013.01); *H01L 21/76831* (2013.01); *H01L 21/76832* (2013.01); *H01L 21/76865* (2013.01); *H01L 23/481* (2013.01); *H01L 2224/08145* (2013.01); *H01L 2225/06541* (2013.01)

(58) Field of Classification Search
CPC ......... H01L 21/76898; H01L 21/76831; H01L 21/76832
See application file for complete search history.

(56) References Cited

U.S. PATENT DOCUMENTS

| | | | |
|---|---|---|---|
| 5,686,354 A | 11/1997 | Avanzino et al. | |
| 11,004,733 B2* | 5/2021 | Weng | H01L 21/76897 |
| 11,031,431 B2* | 6/2021 | Fujii | H01L 27/1469 |
| 11,043,419 B2* | 6/2021 | Kume | H01L 21/76898 |
| 2006/0024966 A1 | 2/2006 | Umemoto et al. | |
| 2010/0127403 A1 | 5/2010 | Muta | |

(Continued)

FOREIGN PATENT DOCUMENTS

| | | |
|---|---|---|
| CN | 1697128 | 11/2005 |
| CN | 101447448 | 6/2009 |

(Continued)

*Primary Examiner* — Daniel Luke
(74) *Attorney, Agent, or Firm* — JCIPRNET

(57) ABSTRACT

Provided are a semiconductor structure and a manufacturing method thereof. A first device structure layer is between a first substrate and a second substrate. A second device structure layer is between the second substrate and the first device structure layer. A first dielectric layer is between the first and second device structure layers. A second dielectric layer is on the second substrate. A through-silicon via (TSV) structure is in the second dielectric layer, the second substrate, the second device structure layer and the first dielectric layer. A connection pad is at the surface of the second dielectric layer and connected to the TSV structure. A first liner is between the TSV structure and the second dielectric layer, the second substrate and the second device structure layer. A second liner is between the top of the TSV structure and the second dielectric layer and a part of the second substrate.

4 Claims, 7 Drawing Sheets

(56) References Cited

U.S. PATENT DOCUMENTS

| | | |
|---|---|---|
| 2013/0161828 A1 | 6/2013 | Lamy |
| 2014/0264862 A1 | 9/2014 | Tsai et al. |
| 2015/0021784 A1 | 1/2015 | Lin |
| 2015/0031202 A1 | 1/2015 | Vitiello et al. |
| 2018/0040547 A1 | 2/2018 | Zuo et al. |
| 2019/0115322 A1* | 4/2019 | Tsai ................. H01L 25/50 |

FOREIGN PATENT DOCUMENTS

| | | |
|---|---|---|
| CN | 102751234 | 10/2012 |
| CN | 103137566 | 6/2013 |
| CN | 104051424 | 9/2014 |
| CN | 106328616 | 1/2017 |
| CN | 109037197 | 12/2018 |
| CN | 109087886 | 12/2018 |
| CN | 109148360 | 1/2019 |
| CN | 110364544 | 10/2019 |
| CN | 110610922 | 12/2019 |
| JP | 2010114201 | 5/2010 |
| JP | 2013157540 | 8/2013 |

\* cited by examiner

METHOD FOR MANUFACTURING THROUGH-SILICON VIA WITH LINER

CROSS-REFERENCE TO RELATED APPLICATION

This application is a divisional application of and claims the priority benefit of U.S. application Ser. No. 16/807,138, filed on Mar. 02, 2020, now allowed. The entirety of the above-mentioned patent application is hereby incorporated by reference herein and made a part of this specification.

BACKGROUND OF THE INVENTION

1. Field of the Invention

The invention relates to a semiconductor structure and a manufacturing method thereof.

2. Description of Related Art

Recently, as circuit designing becomes more complicated and a semiconductor manufacturing process rapidly develops, integrated circuits (IC) develop into a connection method for three-dimensional (3D) circuits, so that a wiring length and an RC delay can be reduced, thereby increasing circuit efficacy. A through-silicon via (TSV) structure is a connection method for three-dimensional circuits, which penetrates through each silicon substrate to serve as a vertical conduction structure between the silicon substrates.

Generally, during formation of a TSV structure, an opening located above and penetrating through the silicon substrate is first formed. Then, an insulating layer is formed on a sidewall of the opening as a liner. Next, an insulating layer at the bottom of the opening is removed to expose a conductive area (such as a connection pad) located below the silicon substrate. Subsequently, a conductive layer is formed in the opening. However, during removal of the insulating layer at the bottom of the opening, a liner at the top of the opening (for example, at the top corner of the opening) is usually damaged, and even the liner at the top of the opening is removed, affecting electrical properties of the TSV structure.

SUMMARY OF THE INVENTION

The invention provides a semiconductor structure in which a liner with a sufficient thickness is disposed around the top of a TSV structure.

The invention provides a method for manufacturing a semiconductor structure to manufacture the above semiconductor structure.

The semiconductor structure of the invention includes a first substrate, a second substrate, a first device structure layer, a second device structure layer, a first dielectric layer, a second dielectric layer, a TSV structure, a connection pad, a first liner, and a second liner. The second substrate is disposed on the first substrate. The first device structure layer is disposed between the first substrate and the second substrate. The second device structure layer is disposed between the second substrate and the first device structure layer. The first dielectric layer is disposed between the first device structure layer and the second device structure layer.

The second dielectric layer is disposed on the second substrate. The TSV structure is disposed in the second dielectric layer, the second substrate, the second device structure layer, and the first dielectric layer and is electrically connected to the first device structure layer. The connection pad is disposed at a surface of the second dielectric layer and is connected to the TSV structure. The first liner is disposed at least between the TSV structure and the second dielectric layer, the second substrate, and the second device structure layer. The second liner is disposed on the first liner and is located between the top of the TSV structure and the second dielectric layer and a part of the second substrate.

In an embodiment of the semiconductor structure of the invention, the second liner extends from the second dielectric layer to partially overlap the second substrate.

In an embodiment of the semiconductor structure of the invention, the first liner extends into the first dielectric layer.

In an embodiment of the semiconductor structure of the invention, the first liner and the second liner are made of a same material.

In an embodiment of the semiconductor structure of the invention, the first liner and the second liner are made of different materials.

The method for manufacturing the semiconductor structure includes the following steps: providing a first substrate, where a first device structure layer is formed on the first substrate; providing a second substrate, where a second device structure layer is formed on the second substrate; bonding the first substrate to the second substrate through a first dielectric layer in such a manner that the first device structure layer and the second device structure layer face each other; forming a second dielectric layer on the second substrate; forming a TSV structure in the second dielectric layer, the second substrate, the second device structure layer, and the first dielectric layer, where the TSV structure is electrically connected to the first device structure layer; forming a first liner at least between the TSV structure and the second dielectric layer, the second substrate, and the second device structure layer; forming a second liner on the first liner, where the second liner is located between the top of the TSV structure and the second dielectric layer and a part of the second substrate; and forming a connection pad at a surface of the second dielectric layer, where the connection pad is connected to the TSV structure.

In an embodiment of the method for manufacturing the semiconductor structure of the invention, the second liner extends from the second dielectric layer to partially overlap the second substrate.

In an embodiment of the method for manufacturing the semiconductor structure of the invention, the first liner extends to a position between the TSV structure and the first dielectric layer.

In an embodiment of the method for manufacturing the semiconductor structure of the invention, a method for forming the TSV structure, the first liner, the second liner, and the connection pad includes the following steps: forming an opening at least in the second dielectric layer, the second substrate, and the second device structure layer; forming a first lining material layer on a sidewall of the opening; forming a patterned photoresist layer, where the opening and a part of the first lining material layer around the opening are exposed from the patterned photoresist layer, and the patterned photoresist layer partially fills the opening; forming a second lining material layer on the patterned photoresist layer and the first lining material layer; performing an anisotropic etching process using the patterned photoresist layer as a mask to remove a part of the first lining material layer, a part of the second lining material layer, and a part of the second dielectric layer to form a groove in the second dielectric layer, and to reserve a part of the first lining material layer on the sidewall and the bottom of the opening and a part of the second lining material layer on the first lining material layer; removing the patterned photoresist layer; removing the first lining material layer on the top surface of the second dielectric layer and the bottom of the opening, and removing the first dielectric layer below the opening to expose a part of the first device structure layer; and forming a conductive layer in the opening and the groove.

In an embodiment of the method for manufacturing the semiconductor structure of the invention, after the first substrate is bonded to the second substrate and before the second dielectric layer is formed, the method further includes reducing a thickness of the second substrate.

Based on the above, in the invention, a liner with a sufficient thickness is formed around the top of the TSV structure. In other words, during formation of the TSV structure, when an etching process is performed to form an opening for defining the TSV structure, the top of the opening has a liner with a sufficient thickness. Therefore, after the etching process, the liner may still remain at the top of the opening, so that the substrate is not exposed.

To make the features and advantages of the invention clear and easy to understand, the following gives a detailed description of embodiments with reference to accompanying drawings.

DESCRIPTION OF THE EMBODIMENTS

The following makes detailed description by listing embodiments and with reference to accompanying drawings, but the provided embodiments are not intended to limit the scope covered by the present invention. In addition, the drawings are drawn only for the purpose of description, and are not drawn according to original sizes. For ease of understanding, same elements in the following description are described by using same signs.

Terms such as "includes", "comprises", and "having" used herein are all inclusive terms, namely, mean "includes but not limited to".

In addition, the directional terms mentioned herein, like "above" and "below", are only used to refer to the directions in the accompanying drawings and are not intended to limit the invention.

FIG. 1A to FIG. 1G are schematic cross-sectional diagrams of a manufacturing process of a semiconductor structure according to an embodiment of the invention.

Figure 1A:
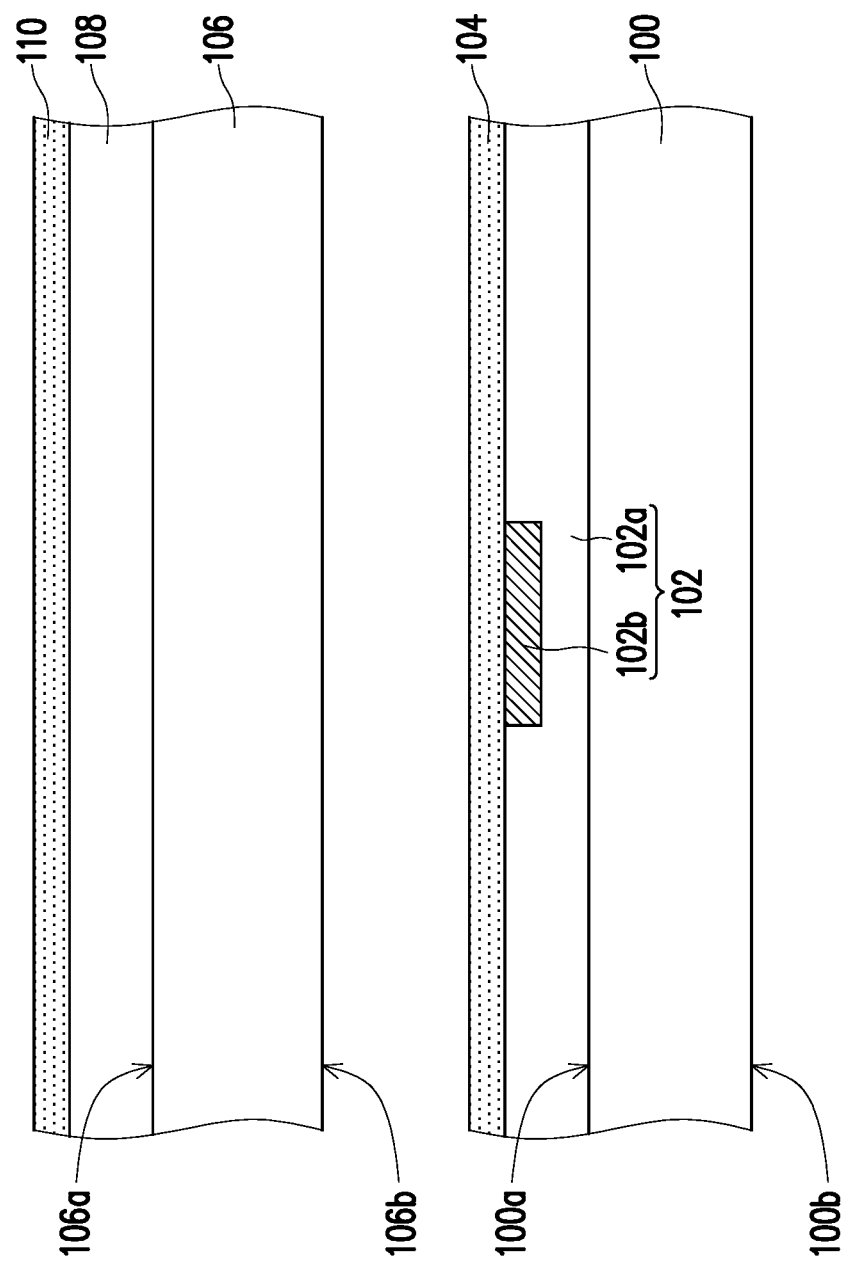
FIG. 1A to FIG. 1G are schematic cross-sectional diagrams of a manufacturing process of a semiconductor structure according to an embodiment of the invention.

First, referring to FIG. 1A, a substrate 100 is provided. The substrate 100 is, for example, a silicon substrate. The substrate 100 has a front surface 100a and a back surface 100b opposed to each other. Then, a device structure layer 102 is formed on the front surface 100a of the substrate 100. In the present embodiment, the device structure layer 102 may include various electronic devices (not shown for clarity) such as a transistor, etc. formed on the substrate 100, a dielectric layer 102a covering the electronic devices, and a circuit layer (not shown in full for clarity) located in the dielectric layer 102a and electrically connected to the electronic devices. A circuit layer located at a surface of the dielectric layer 102a may be considered as a connection pad 102b. However, the invention is not limited thereto. Next, a dielectric layer 104 is formed on the device structure layer 102. In the present embodiment, the dielectric layer 104 is, for example, an oxide layer, which may be used as a bonding layer for subsequently bonding two substrates.

In addition, a substrate 106 is provided. The substrate 106 is, for example, a silicon substrate. The substrate 106 has a front surface 106a and a back surface 106b opposed to each other. Then, a device structure layer 108 is formed on the front surface 106a of the substrate 106. In the present embodiment, the device structure layer 108 has an architecture the same as or similar to the device structure layer 102, but the invention is not limited thereto. The device structure layer 108 may include various electronic devices formed on the substrate 100, a dielectric layer covering the electronic devices, and a circuit layer located in the dielectric layer and electrically connected to the electronic devices (not shown for clarity). Next, a dielectric layer 110 is formed on the device structure layer 108. In the present embodiment, the dielectric layer 104 is, for example, an oxide layer, which may be used as a bonding layer for subsequently bonding two substrates.

Figure 1B:
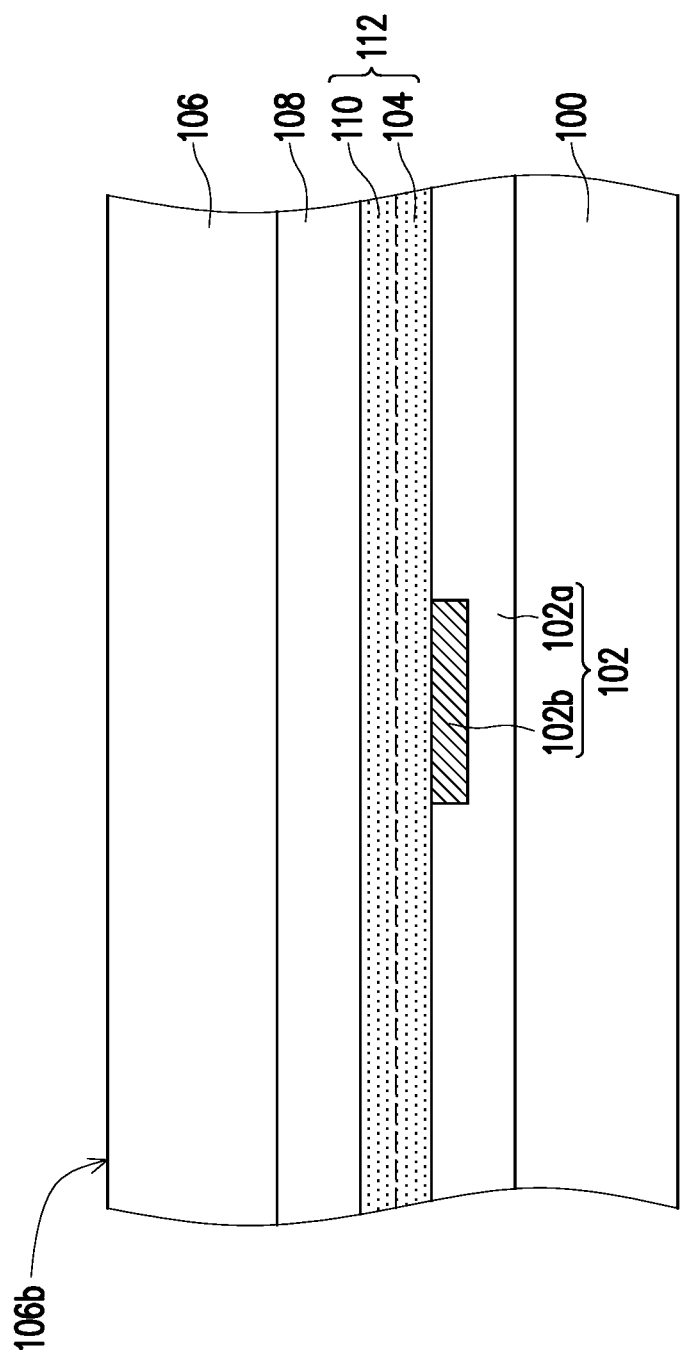

Next, referring to FIG. 1B, the substrate 100 is bonded to the substrate 106 in such a manner that the device structure layer 102 and the device structure layer 108 face each other. In the present embodiment, the substrate 100 is bonded to the substrate 106 through bonding of the dielectric layer 104 to the dielectric layer 110. This manner may be referred to as fusion bonding (fusion bond). After the dielectric layer 104 is bonded to the dielectric layer 110, a dielectric layer 112 is formed. Then the back surface 106b of the substrate 106 may be polished to reduce a thickness of the substrate 106, but the invention is not limited thereto.

Figure 1C:
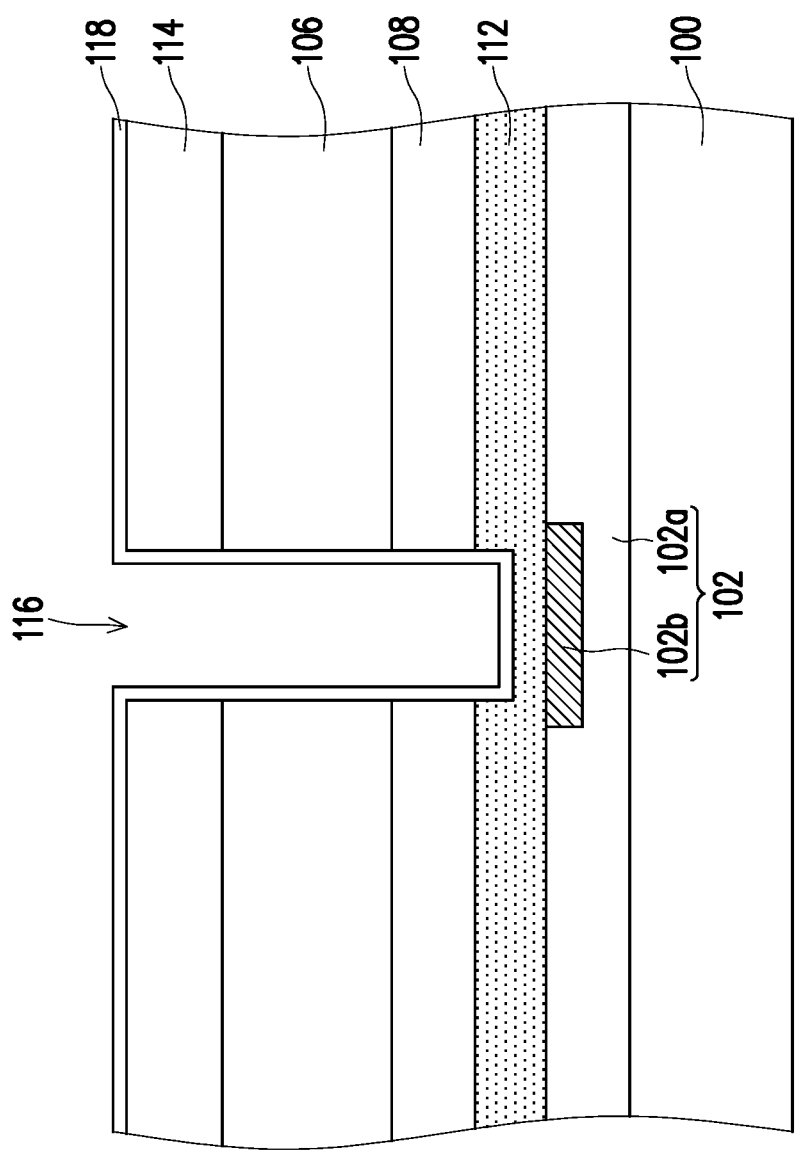

Then, referring to FIG. 1C, a dielectric layer 114 is formed on the back surface 106b of the substrate 106. The dielectric layer 114 is, for example, an oxide layer, a nitride layer, or an oxynitride layer. The dielectric layer 114 can serve as a protective layer for the substrate 106. Next, a patterning process is performed to form an opening 116 in the dielectric layer 114, the substrate 106, the device structure layer 108, and the dielectric layer 112. In the present embodiment, the bottom of the opening 116 is located in the dielectric layer 112, and the opening 116 does not penetrate through the dielectric layer 112. However, the present invention is not limited thereto. In other embodiments, the bottom of the opening 116 may be coplanar with the top surface of the dielectric layer 112, that is, the opening penetrates through the substrate 108 but does not penetrate into the dielectric layer 112. The opening 116 does not penetrate through or penetrate into the dielectric layer 112, so that the circuit layer (the connection pad 102b in the present embodiment) in the device structure 102 can be prevented from being damaged as a result of being exposed in a subsequent process. Then a lining material layer 118 is conformally formed. The lining material layer 118 covers the top surface of the dielectric layer 114 and a sidewall and the bottom of the opening 116. In the present embodiment, the lining material layer 118 is, for example, an oxide layer.

Figure 1D:
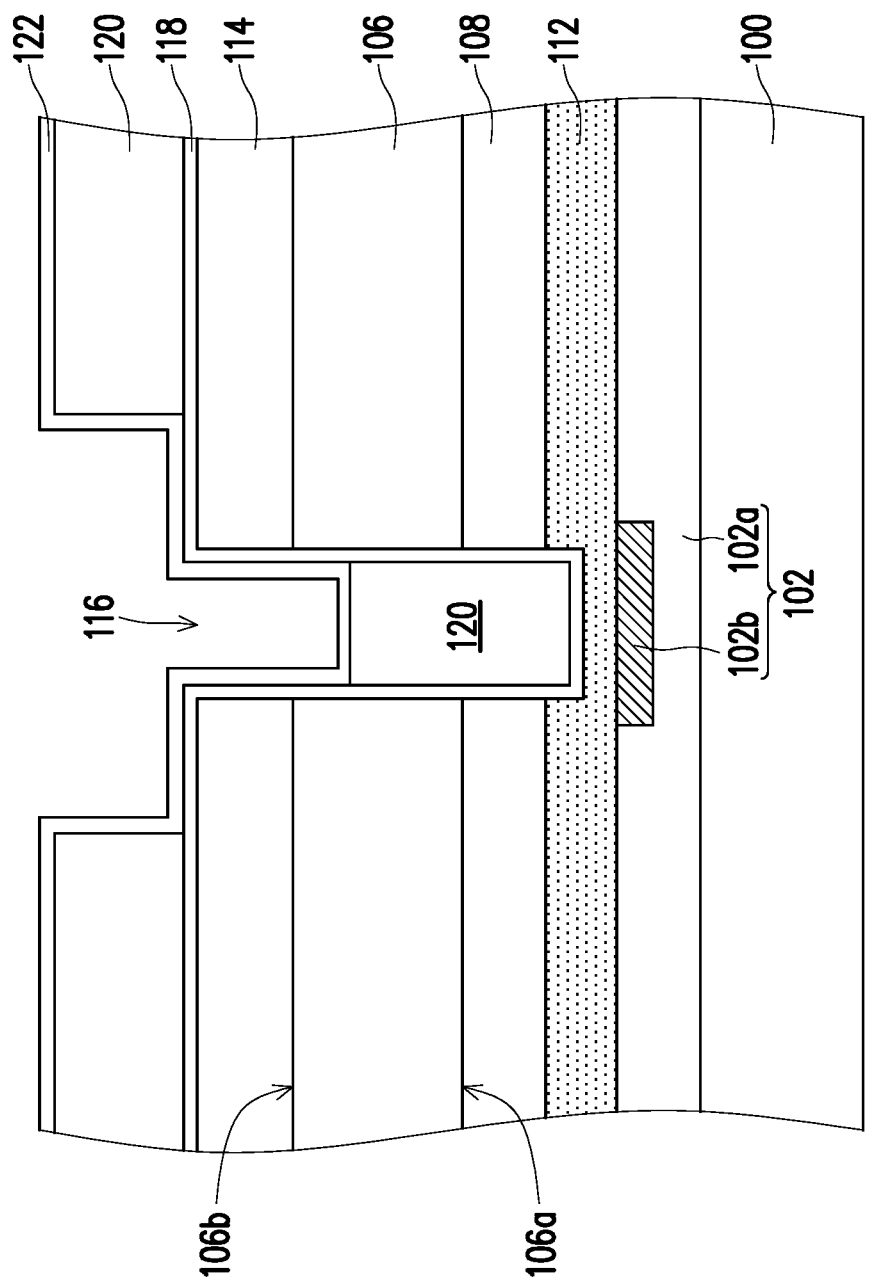

Next, referring to FIG. 1D, a patterned photoresist layer 120 is formed. The patterned photoresist layer 120 is located on the dielectric layer 114 and in the opening 116. In particular, the opening 116 and a part of the lining material layer 118 around the opening are exposed from the patterned photoresist layer 120 located on the dielectric layer 114. The area exposed from the patterned photoresist layer 120 is an area for subsequently forming a connection pad. In addition, the patterned photoresist layer 120 located in the opening 116 is located at the bottom of the opening 116, that is, partially filled in the opening 116. In addition, the top surface of the patterned photoresist layer 120 located in the opening 116 is lower than the back surface 106*b* of the substrate 106, and preferably, is higher than the front surface 106*a* of the substrate 106. Then a lining material layer 122 is conformally formed. The lining material layer 122 covers the patterned photoresist layer 120 located on the dielectric layer 114, the exposed lining material layer 118, and the patterned photoresist layer 120 located in the opening 116. In the present embodiment, the lining material layer 122 is, for example, a low-temperature oxide layer, which is different from the lining material layer 118, but the invention is not limited thereto. In other embodiments, the lining material layer 122 and the lining material layer 118 may be made of a same material.

Figure 1E:
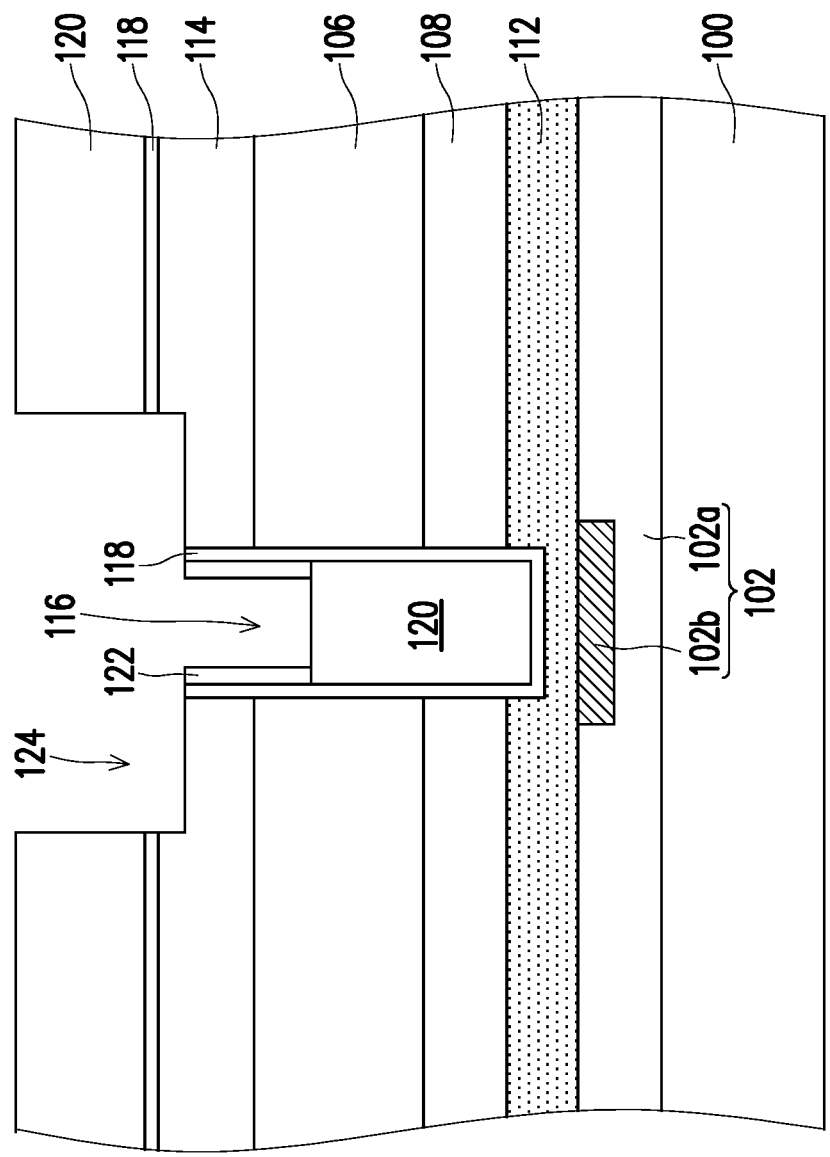

Then, referring to FIG. 1E, an anisotropic etching process is performed using the patterned photoresist layer 120 as a mask. In this step, the lining material layer 122 covering the patterned photoresist layer 120, the lining material layer 122 and the lining material layer 118 exposed from the patterned photoresist layer 120 outside the opening 116, a part of the dielectric layer 114 located around the opening 116, and the lining material layer 122 on the top surface of the patterned photoresist layer 120 located in the opening 116 are removed. In this way, the lining material layer 118 is reserved on the sidewall and the bottom of the opening 116, the lining material layer 122 is reserved on the lining material layer 118 at the top of the opening 116, and a groove 124 is formed in the dielectric layer 114. The groove 124 is an area for subsequently forming a connection pad.

Figure 1F:
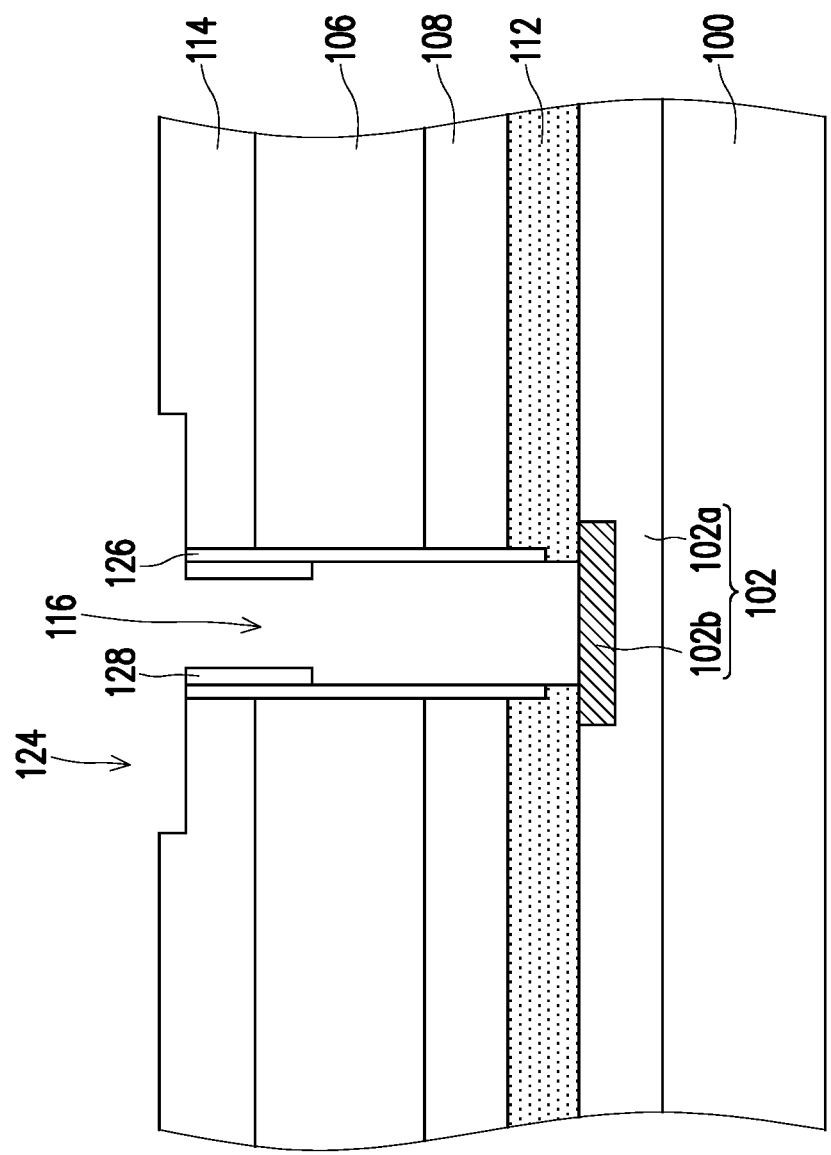

Next, referring to FIG. 1F, the patterned photoresist layer 120 is removed. Then, an anisotropic etching process is performed to remove the lining material layers 118 on the top surface of the dielectric layer 114 and at the bottom of the opening 116 to form a liner 126 and a liner 128, and the dielectric layer 112 below the opening 116 is removed to expose a part of the circuit layer (the connection pad 102*b* in the present embodiment) in the device structure layer 102. The formed liner 126 is located on the sidewall of the opening 116, and the formed liner 128 is located on the liner 126 and extends from the dielectric layer 114 to partially overlap the substrate 106.

During the anisotropic etching process, since the top of the opening 116 (especially an upper corner of the opening 116) has the lining material layer 118 and the lining material layer 122, after the lining material layer 118 and the dielectric layer 112 at the bottom of the opening 116 are removed, a lining material layer with a sufficient thickness can still remain at the top of the opening 116. In particular, when the lining material layer 122 and the lining material layer 118 are made of different materials, the lining material layer 122 may serve as a protective layer for the lining material layer 118 during etching. In this way, it may be further ensured that a lining material layer with a sufficient thickness can still remain at the top of the opening 116 after the etching process.

Figure 1G:
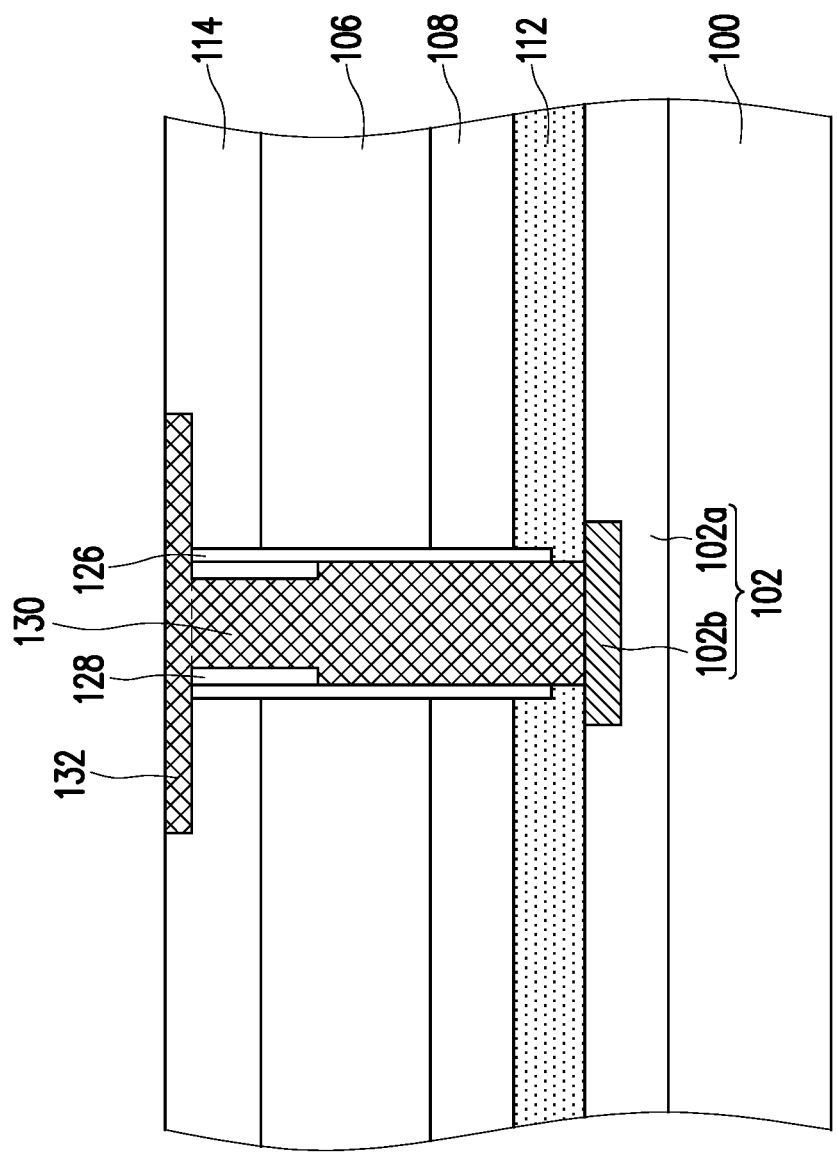

Then, referring to FIG. 1G, a conductive layer is formed in the opening 116 and the groove 124. The conductive layer in the opening 116 is used as the TSV structure 130, and the conductive layer in the groove 124 is used as the connection pad 132 connected to the TSV structure 130.

As shown in FIG. 1G, the semiconductor structure of the present invention includes a substrate 100, a substrate 106, a device structure layer 102, a device structure layer 108, a dielectric layer 112, a dielectric layer 114, a TSV structure 130, a connection pad 132, a liner 126, and a liner 128. The substrate 106 is disposed on the substrate 100. The device structure layer 102 is disposed between the substrate 100 and the substrate 106. The device structure layer 108 is disposed between the substrate 106 and the device structure layer 102. The dielectric layer 112 is disposed between the device structure layer 102 and the device structure layer 108. The dielectric layer 114 is disposed on the substrate 106. The TSV 130 is disposed in the dielectric layer 114, the substrate 106, the device structure layer 108, and the dielectric layer 112, and is electrically connected to a circuit layer (a connection pad 102*b*) of the device structure layer 102. The connection pad 132 is disposed at a surface of the dielectric layer 114 and is connected to the TSV 130. The liner 126 is disposed between the TSV structure 130 and the dielectric layer 114, the substrate 106, the device structure layer 108, and the dielectric layer 112. The liner 128 is disposed on the liner 126 and is located between the top of the TSV 130 and the dielectric layer 114 and a part of the substrate 106, that is, the liner 128 extends from the dielectric layer 114 to partially overlap the substrate 106.

In the present embodiment, the liner 126 is disposed between the TSV structure 130 and the dielectric layer 114, the substrate 106, the device structure layer 108, and the dielectric layer 112, that is, the liner 126 extends into the dielectric layer 112. However, the invention is not limited thereto. In other embodiments, the liner 126 may extend to only a surface of the dielectric layer 112.

Although the invention is described with reference to the above embodiments, the embodiments are not intended to limit the invention. A person of ordinary skill in the art may make variations and modifications without departing from the spirit and scope of the invention. Therefore, the protection scope of the invention should be subject to the appended claims.

What is claimed is:

1. A method for manufacturing a semiconductor structure, comprising:

providing a first substrate, wherein a first device structure layer is formed on the first substrate;

providing a second substrate, wherein a second device structure layer is formed on the second substrate;

bonding the first substrate to the second substrate through a first dielectric layer in such a manner that the first device structure layer and the second device structure layer face each other;

forming a second dielectric layer on the second substrate;

forming a through-silicon via (TSV) structure in the second dielectric layer, the second substrate, the second device structure layer, and the first dielectric layer, wherein the TSV structure is electrically connected to the first device structure layer;

forming a first liner at least between the TSV structure and the second dielectric layer, between the TSV structure and the second substrate, and between the TSV structure and the second device structure layer;

forming a second liner on the first liner, wherein the second liner is located between the top of the TSV structure and the second dielectric layer and between the top of the TSV structure and a part of the second substrate, wherein a bottom surface of the second liner is located between the top surface of the second substrate and the bottom surface of the second substrate; and forming a connection pad at a surface of the second dielectric layer, wherein the connection pad is connected to the TSV structure.

2. The method for manufacturing the semiconductor structure according to claim 1, wherein the first liner extends to a position between the TSV structure and the first dielectric layer.

3. The method for manufacturing the semiconductor structure according to claim 1, wherein a method for forming the TSV structure, the first liner, the second liner, and the connection pad comprises:
  forming an opening at least in the second dielectric layer, the second substrate, and the second device structure layer;
  forming a first lining material layer on a sidewall of the opening;
  forming a patterned photoresist layer, wherein the opening and a part of the first lining material layer around the opening are exposed from the patterned photoresist layer, and the patterned photoresist layer partially fills the opening;
  forming a second lining material layer on the patterned photoresist layer and the first lining material layer;
  performing an anisotropic etching process using the patterned photoresist layer as a mask to remove a part of the first lining material layer, a part of the second lining material layer, and a part of the second dielectric layer to form a groove in the second dielectric layer, and to reserve a part of the first lining material layer on the sidewall and the bottom of the opening and a part of the second lining material layer on the first lining material layer;
  removing the patterned photoresist layer;
  removing the first lining material layer on the top surface of the second dielectric layer and the bottom of the opening, and removing the first dielectric layer below the opening to expose a part of the first device structure layer; and
  forming a conductive layer in the opening and the groove.

4. The method for manufacturing the semiconductor structure according to claim 1, wherein after bonding the first substrate to the second substrate and before forming the second dielectric layer, the method further comprises reducing a thickness of the second substrate.

* * * * *